(12) United States Patent
Kanskar et al.

(10) Patent No.: US 7,596,159 B2
(45) Date of Patent: Sep. 29, 2009

(54) SEMICONDUCTOR LASER DIODE (75) Inventors: Manoj Kanskar, Madison, WI (US);
Thomas Lester Earles, Verona, WI (US); Eric Warren Stiers, Madison, WI (US)

(73) Assignee: Alfalight Inc., Madison, WI (US)

( * ) Notice: Subject to any disclaimer, the term of this patent is extended or adjusted under 35 U.S.C. 154(b) by 179 days.

(21) Appl. No.: 11/664,872

(22) PCT Filed: Oct. 11, 2005

(86) PCT No.: PCT/US2005/036360

§ 371 (c)(1),
(2), (4) Date: Apr. 6, 2007

(87) PCT Pub. No.: WO2006/044314

PCT Pub. Date: Apr. 27, 2006

(65) Prior Publication Data

US 2008/0089375 A1      Apr. 17, 2008

Related U.S. Application Data

(60) Provisional application No. 60/617,430, filed on Oct. 12, 2004.

(51) Int. Cl.
*H01S 5/00*      (2006.01)
(52) U.S. Cl. ............ 372/43.01; 372/45.01; 372/45.012

(58) Field of Classification Search .............. 372/43.01, 372/45.01
See application file for complete search history.

(56) References Cited

U.S. PATENT DOCUMENTS

2006/0023763 A1 *   2/2006   Farmer et al. ............ 372/45.01

FOREIGN PATENT DOCUMENTS

JP              2001313442           11/2001

* cited by examiner

*Primary Examiner*—Dung T Nguyen
(74) *Attorney, Agent, or Firm*—William L. Botjer (57) ABSTRACT

A semiconductor laser diode comprises a p-n junction. The p-n junction comprises a substrate, an n-type semiconductor layer, a p-type semiconductor layer, and a quantum well. The quantum well is disposed between the n-type semiconductor layer and the p-type semiconductor layer. The substrate is formed from a first material system, the n-type semiconductor layer is formed from a second material system, the p-type semiconductor layer is formed from a third material system, and the quantum well is formed from a fourth material system. The second material system is different from the third material system. The second material system and the third material system are selected such that there is an increase in the rate of recombinations of the electrons from the n-type semiconductor layer and the holes from the p-type semiconductor layer in the quantum well. This results in a lower turn-on voltage for the semiconductor laser diode.

34 Claims, 8 Drawing Sheets

| | | | | | | | | | | | | |
|---|---|---|---|---|---|---|---|---|---|---|---|---|
| p-contact metal | GaAs p-contact layer | 50% AlGaAs p-type cladding layer | 50% AlGaAs p-type cladding layer | 20% AlGaAs p-type confinement layer | 20% AlGaAs p-type confinement layer | InGaAs quantum well | InGaAsP n-type confinement layer | InGaAsP n-type confinement layer | InGaP n-type cladding layer | InGaP n-type cladding layer | GaAs buffer layer | GaAs substrate | n-contact metal |
| 628 | 624 | 618 | 616 | 614 | 612 | 620 | 604 | 606 | 608 | 610 | 626 | 602 | 622 |

| | 702 | 704 | 706 | 708 |
|---|---|---|---|---|
| | Type of material | Type of layer | Thickness of layer | Amount of doping agent |
| 628 | Ti-Pt-Au/Au-Ge | p-contact metal | 5 μm | none |
| 624 | GaAs (Ga: 50%, As: 50%) | p-contact layer | 150nm | C: 1e19 –1e20 cm-3 |
| 618 | AlGaAs (Al: 25%, Ga: 25%, As: 50%) | p-type cladding layer | 480nm | Zn: 1e18-5e18 cm-3 |
| 616 | AlGaAs (Al: 25%, Ga: 25%, As: 50%) | p-type cladding layer | 120nm | Zn: 5e17-3e18 cm-3 |
| 614 | AlGaAs (Al: 10%, Ga: 40%, As: 50%) | p-type confinement layer | 575nm | Zn: undoped-5e17 cm-3 |
| 612 | AlGaAs (Al: 10%, Ga: 40%, As: 50%) | p-type confinement layer | 75nm | Zn: undoped-1e17 cm-3 |
| 620 | InGaAs (In: 6%, Ga: 44%, As: 50%) | Quantum well | 8.5nm | none |

Fig. 7a

|  | 702 | 704 | 706 | 708 |
|---|---|---|---|---|
|  | Type of material | Type of layer | Thickness of layer | Amount of doping agent |
| 604 | InGaAsP (In:11.7%, Ga: 38.3%, P: 23.8%, As: 26.2%) | n-type confinement layer | 75nm | Si: undoped-1e17 cm-3 |
| 606 | InGaAsP (In: 11.7%, Ga: 38.3%, P: 23.8%, As: 26.2%) | n-type confinement layer | 575nm | Si: undoped-5e17 cm-3 |
| 608 | InGaP (In: 25%, Ga: 25%, and P: 50%) | n-type cladding layer | 120nm | Si: 5e17 - 3e18 cm-3 |
| 610 | InGaP (In: 25%, Ga: 25%, and P: 50%) | n-type cladding layer | 480nm | Si: 1e18-5e18 cm-3 |
| 626 | GaAs (Ga: 50%, As: 50%) | Buffer layer | 500nm | Si: 1-3 e18 cm-3 |
| 602 | GaAs (Ga: 50%, As: 50%) | n-Substrate | 350μm | Si: 1-5 e18 cm-3 |
| 622 | Ti-Pt-Au/Au-Ge | n-contact metal | 5μm | none |

Fig. 7b

SEMICONDUCTOR LASER DIODE

REFERENCE TO RELATED APPLICATIONS

This application claims the priority of U.S. provisional application S.N. 60/617,430 filed Oct. 12, 2004 and titled: "Semiconductor Laser Diode Device With Asymmetric Material For Improved Efficiency"

BACKGROUND

The present invention relates generally to semiconductor devices, and more specifically, to semiconductor laser diodes.

Semiconductor laser diodes are constructed from an electrical p-n junction and a quantum well. The electrical p-n junction has an n-side and a p-side. The quantum well is provided between the n-side and the p-side. Electrons from the n-side and holes from the p-side of the p-n junction recombine in the quantum well, which results in an emission of laser light. The n-side and the p-side of the p-n junction form an optical waveguide for the emitted laser light.

Semiconductor laser diodes generate heat during their operation. The heat generated is removed by an external cooling system. For a fixed level of laser light output, the energy consumed by the external cooling system is inversely proportional to the power conversion efficiency of a semiconductor laser diode. The power conversion efficiency of the semiconductor laser diode is proportional to the rate of recombinations of the electrons from the n-side and the holes from the p-side in the quantum well and inversely proportional to the operating voltage of the semiconductor laser diode.

The operating voltage of a semiconductor laser diode depends mainly on three factors: (1) the lasing wavelength of the semiconductor laser diode, (2) the resistance of the semiconductor laser diode, and (3) the band offsets of the different material systems that are used to form the n-side and the p-side of the semiconductor laser diode.

In order to produce a desired lasing wavelength, the electrons at the quantum well require an energy, which is $hc/\lambda$ above the energy of the holes, where h is Planck's constant, c is the speed of light in the laser diode medium, and $\lambda$ is the wavelength at which the laser is being operated. Since the energy difference $hc/\lambda$ for a given wavelength is determined by the basic physical parameters, the operating voltage of the semiconductor laser diode cannot be lowered by lowering the energy difference $hc/\lambda$.

The resistance of the semiconductor laser diode depends on factors such as, the mobility of the electrons and the holes within the semiconductor laser diode and the doping levels of the material systems that are used to form the n-side and the p-side of the semiconductor laser diode. The doping levels of the material systems used to form the n-side and the p-side of the semiconductor laser diode may be selected to reduce the overall resistance of the semiconductor laser diode. Further, the doping levels of the material systems are selected such that excessive absorption of light within the semiconductor laser diode is avoided.

The electrons on the n-side and the holes on the p-side require energy to move into the quantum well. This energy is equal to the band offset of the material system used to form the semiconductor laser diode. The band offset of the material system is measured relative to the band energy of the substrate. An external voltage source provides the energy required by the electrons and the holes. The external voltage provided is proportional to the band offset.

Existing semiconductor laser diodes have the n-side and the p-side formed from a single material system. Examples of the material system include Aluminum Gallium Arsenide (AlGaAs) and Indium Gallium Arsenic Phosphide (InGaAsP). The substrate of the semiconductor laser diode is formed from a first material system that is different from the material system used to form the n-side and the p-side. Examples of the first material system include Gallium Arsenide (GaAs) and Indium Phosphide (InP). Any given material system will have a characteristic set of valence band and conduction band offsets calculated relative to the first material system, which affect both the turn-on voltage for the semiconductor laser diode and the efficiency of confining the electrons and the holes within the quantum well. An ideal material system should have a small valence band offset for the holes and a large conduction band offset for the electrons on the p-side of the semiconductor laser diode. At the same time, the ideal material system should have a large valence band offset for the holes and a small conduction band offset for the electrons on the n-side of the semiconductor laser diode. These competing band offset conditions may not be achieved by using a single material system. Therefore, a semiconductor laser diode formed from a single material system has a higher turn-on voltage and a lower charge carrier confinement at the quantum well. High power conversion efficiency requires low turn-on voltages and good charge carrier confinement.

In view of the foregoing discussion, there is a need to improve the power conversion efficiency of the existing semiconductor laser diodes. In addition, there is a need to lower the turn-on voltage for the existing semiconductor laser diodes while maintaining good charge carrier confinement at the quantum well.

SUMMARY

An object of the invention is to improve the power conversion efficiency of the existing semiconductor devices comprising p-n junctions.

Another object of the invention is to lower the turn-on voltage for the existing semiconductor devices comprising p-n junctions.

Yet another object of the invention is to minimize the impact of energy band offsets for a semiconductor laser diode without affecting the optical properties of the semiconductor laser diode.

The present invention provides a semiconductor laser diode comprising a substrate, an n-type semiconductor layer, a p-type semiconductor layer, and one or more quantum wells. The substrate is formed from a first material system. The n-type semiconductor layer is formed from a second material system. The p-type semiconductor layer is formed from a third material system. The third material system is different from the second material system. The second material system has a conduction band offset lower than the conduction band offset of the third material system. The conduction band offsets are calculated relative to the conduction band energy of the first material system. The third material system has a valence band offset lower than the valence band offset of the second material system. The valence band offsets are calculated relative to the valence band energy of the first material system. The one or more quantum wells are provided between the n-type semiconductor layer and the p-type semiconductor layer. The one or more quantum wells are formed from the fourth material system. The n-type semiconductor layer and the p-type semiconductor layer form a waveguide for light emitted by the semiconductor laser diode.

To achieve the above objectives, the present invention also provides a method for forming a semiconductor laser diode.

The method includes providing a substrate formed from a first material system, selecting a second material system, providing an n-type semiconductor layer formed from the second material system, providing one or more quantum wells, selecting a third material system, and providing a p-type semiconductor layer formed from the third material system. The second material system has a conduction band offset lower than the conduction band offset of the third material system. The third material system has a valence band offset lower than the valence band offset of the second material system. The conduction band offset is calculated relative to the conduction band energy of the first material system. The valence band offset is calculated relative to the valence band energy of the first material system. The third material system is different from the second material system. The p-type semiconductor layer is provided such that the one or more quantum wells are between the n-type semiconductor layer and the p-type semiconductor layer. The one or more quantum wells are formed from the fourth material system. The n-type semiconductor layer and the p-type semiconductor layer form a waveguide for the light emitted by the semiconductor laser diode.

The various embodiments describe the use of different material systems for forming the n-type semiconductor layers and the p-type semiconductor layers of a p-n junction of a semiconductor laser diode. The use of different material systems for forming the n-type semiconductor layers and the p-type semiconductor layers results in an increased rate of electron-hole recombinations in the quantum well of a semiconductor laser diode. The increase in the rate of electron-hole recombinations lowers the turn-on voltage and increases the power conversion efficiency of the semiconductor laser diode.

BRIEF DESCRIPTION OF THE FIGURES

The various embodiments of the invention will hereinafter be described in conjunction with the appended drawings provided to illustrate and not to limit the invention in which the layers are not necessarily shown to scale, wherein like designations denote like elements, and in which.

DETAILED DESCRIPTION OF THE INVENTION

Figure 1:
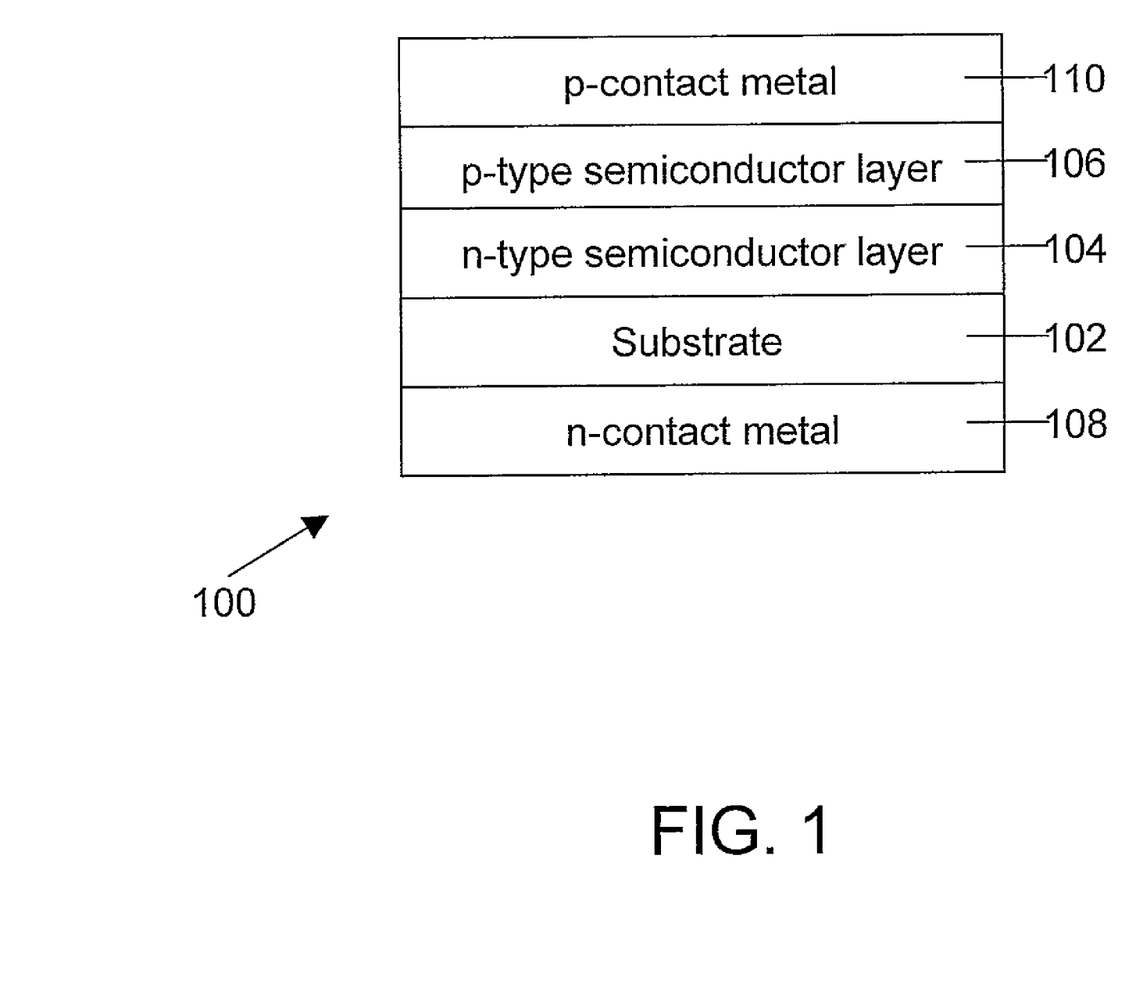
FIG. 1 illustrates the layers of a p-n junction, in accordance with an embodiment of the invention.

FIG. 1 illustrates the layers of a p-n junction 100, in accordance with an embodiment of the invention. p-n junction 100 is a basic component of an electronic device. Examples of the electronic device include transistor, a diode, a light emitting diode and a semiconductor laser diode. p-n junction 100 includes a substrate 102, an n-type semiconductor layer 104, and a p-type semiconductor layer 106. As illustrated in FIG. 1, n-type semiconductor layer 104 is provided on substrate 102 and p-type semiconductor layer 106 is provided on n-type semiconductor layer 104.

In various embodiments of the invention, substrate 102 is made from a first material system. The first material system includes materials such as Indium (In), Gallium (Ga), Aluminum (Al), Arsenic (As) and Phosphorous (P). Examples of the first material system include Gallium Arsenide (GaAs) and Indium Phosphide (InP). However, it will be apparent to a person skilled in the art that any other relevant material system may be used to form substrate 102.

In various embodiments of the invention, n-type semiconductor layer 104 is formed from a second material system. The second material system includes materials such as Indium (In), Gallium (Ga), Aluminum (Al), Arsenic (As) and Phosphorous (P). Examples of the second material system include InGaAsP and AlInGaP. In addition, the second material system is doped with a doping agent to make the second material system n-type. Examples of the doping agent include Silicon, and Selenium. However, the invention should not be construed to be limited to the use of only the above-mentioned examples of the doping agent; other doping agents may be used without deviating from the scope of the invention.

In various embodiments of the invention, p-type semiconductor layer 106 is formed from a third material system. The third material system is different from the second material system. The third material system includes materials such as Indium (In), Gallium (Ga), Aluminum (Al), Arsenic (As) and Phosphorous (P). For example, AlGaAs may be used as a third material system. In addition, the third material system is doped with a doping agent to make the third material system p-type. Examples of the doping agent include Zinc, Carbon, and Beryllium. However, the invention should not be construed to be limited to the use of only the above-mentioned examples of the doping agent; other doping agents may be used without deviating from the scope of the invention.

The second material system is selected such that the second material system has a conduction band offset lower than the conduction band offset of the third material system. The conduction band offset is calculated relative to the conduction band energy of the first material system. The lower conduction band offset of the second material system than that of the third material system results in a lower turn-on voltage for p-n junction 100. The third material system is selected such that the third material system has a valence band offset lower than the valence band offset of the second material system. The valence band offsets are calculated relative to the valence band energy of the first material system. The lower valence band offset of the third material system than that of the second material system results in a lower turn-on voltage for p-n junction 100.

For example, p-n junction 100 includes substrate 102 formed from GaAs, n-type semiconductor layer 104 formed from InGaAsP, and p-type semiconductor layer 106 formed from AlGaAs. n-type semiconductor layer 104 has the following composition In: 11.7%, Ga: 38.3%, P: 23.8% and As: 26.2%. n-type semiconductor layer 104 is doped with Silicon. The concentration of Silicon may vary from 0 atoms to $10^{17}$ atoms per $cm^3$ of n-type semiconductor layer 104. p-type semiconductor layer 106 has the following composition Al: 10%, Ga: 40% and As: 50%. p-type semiconductor layer 106 is doped with Zinc. The concentration of Zinc may vary from 0 atoms to $10^{17}$ atoms per $cm^3$ of p-type semiconductor layer 106.

In p-n junction 100 with n-type semiconductor layer 104 formed from the second material system, and p-type semiconductor layer 106 formed from the third material system, the combination of lower conduction band offset of the second material system compared to that of the third material system and lower valence band offset of the third material system compared to that of the second material system results in a lower turn-on voltage for p-n junction 100.

In an embodiment of the invention, p-n junction 100 further includes an n-contact metal 108 such as Titanium-Platinum-Gold (Ti—Pt—Au) stack placed over a Gold-Germanium (Au—Ge) alloy and a p-contact metal 110 such as Titanium-Platinum-Gold (Ti—Pt—Au) stack placed over a Gold-Germanium (Au—Ge) alloy. n-contact metal 108 is provided on substrate 102. p-contact metal 110 is provided on p-type semiconductor layer 106. n-contact metal 108 provides an electrical connection to n-type semiconductor layer 104. p-contact metal 110 provides an electrical connection to p-type semiconductor layer 106.

Figure 2A:
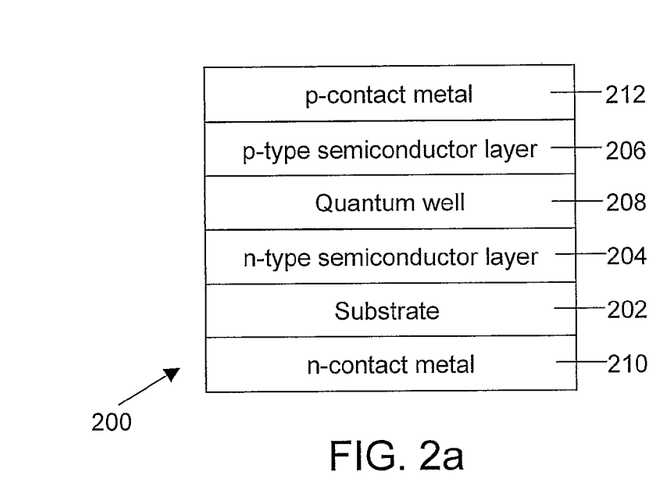
FIG. 2 illustrates the layers of a semiconductor laser diode, in accordance with an embodiment of the invention.

FIG. 2a illustrates the layers of a semiconductor laser diode 200, in accordance with an embodiment of the invention. A semiconductor laser diode is a diode that emits coherent light by stimulated emission. Semiconductor laser diode 200 includes a substrate 202, an n-type semiconductor layer 204, a p-type semiconductor layer 206 and a quantum well 208. As illustrated in FIG. 2a, n-type semiconductor layer 204 is provided on substrate 202, p-type semiconductor layer 206 is provided on n-type semiconductor layer 204, and quantum well 208 is disposed between n-type semiconductor layer 204 and p-type semiconductor layer 206.

When an electric current is passed through semiconductor laser diode 200, the electrons from n-type semiconductor layer 204 and the holes from p-type semiconductor layer 206 are injected into quantum well 208. The electrons and the holes recombine radiatively in quantum well 208. This recombination of the electrons and the holes results in the emission of laser light. The surface of n-type semiconductor layer 204 and the surface of p-type semiconductor layer 206, which are adjacent to quantum well 208, form parallel edges. These parallel edges act as an optical waveguide for the laser light emitted in quantum well 208.

In various embodiments of the invention, substrate 202 is formed from a first material system. The first material system includes materials such as Indium (In), Gallium (Ga), Aluminum (Al), Arsenic (As) and Phosphorous (P). Examples of the first material system include GaAs and InP. However, it will be apparent to a person skilled in the art that any other relevant material system may be used to form substrate 102.

In various embodiments of the invention, n-type semiconductor layer 204 is formed from a second material system. The second material system includes materials such as Indium (In), Gallium (Ga), Aluminum (Al), Arsenic (As) and Phosphorous (P). Examples of the second material system include InGaAsP and AlInGaP. In addition, the second material system is doped with a doping agent to make the second material system n-type. Examples of the doping agent include Silicon and Selenium. However, the invention should not be construed to be limited to the use of only the above-mentioned examples of the doping agent; other doping agents may be used without deviating from the scope of the invention.

In various embodiments of the invention, p-type semiconductor layer 206 is formed from a third material system. The third material system includes materials such as Indium (In), Gallium (Ga), Aluminum (Al), Arsenic (As) and Phosphorous (P). For example, AlGaAs may be used as a third material system. In addition, the third material system is doped with a doping agent to make the third material system p-type. Examples of the doping agent include Zinc, Carbon, and Beryllium. However, the invention should not be construed to be limited to the use of only the above-mentioned examples of doping agents; other doping agents may be used without deviating from the scope of the invention.

The second material system is selected such that the second material system has a conduction band offset lower than the conduction band offset of the third material system. The conduction band offset is calculated relative to the conduction band energy of the first material system. The lower conduction band offset of the second material system compared to that of the third material system results in a lower turn-on voltage for semiconductor laser diode 200. The third material system is selected such that the third material system has a valence band offset lower than the valence band offset of the second material system. The valence band offsets are calculated relative to the valence band energy of the first material system. The lower valence band offset of the third material system compared to that of the second material system results in a lower turn-on voltage for semiconductor laser diode 200. In an embodiment of the invention, the second material system and the third material system are selected based on a graph of optical index vs. band offset. The selection of the second material system and the third material system based on the graph of optical index vs. band offset is explained in conjunction with FIG. 5.

In various embodiments of the invention, quantum well 208 is formed from a fourth material system. The fourth material system includes materials such as Indium (In), Gallium (Ga), Aluminum (Al), Arsenic (As) and Phosphorous (P). Examples of the fourth material system include InGaAsP, AlGaAs, and AlInGaP. In an embodiment of the invention, the fourth material system may be doped with a doping agent. Examples of the doping agent include Silicon, Selenium, Zinc, Carbon, and Beryllium. However, the invention should not be construed to be limited to the use of only the above-mentioned examples of doping agents; other doping agents may be used without deviating from the scope of the invention.

For example, semiconductor laser diode 200 includes substrate 202 formed from GaAs, n-type semiconductor layer 204 formed from InGaAsP, p-type semiconductor layer 206 formed from AlGaAs, and quantum well 208 formed from InGaAs. n-type semiconductor layer 204 has the following composition In: 11.7%, Ga: 38.3%, P: 23.8% and As: 26.2%. n-type semiconductor layer 204 is doped with Silicon. The concentration of Silicon may vary from 0 atoms to $10^{17}$ atoms per $cm^3$ of n-type semiconductor layer 204. p-type semiconductor layer 206 has the following composition Al: 10%, Ga: 40% and As: 50%. p-type semiconductor layer 206 is doped with Zinc. The concentration of Zinc may vary from 0 atoms to $10^{17}$ atoms per $cm^3$ of p-type semiconductor layer 206. Quantum well 208 has the following composition In: 6%, Ga: 44% and As: 50%.

The use of the second material system and the third material system for forming n-type semiconductor layer 204 and p-type semiconductor layer 206 respectively increases the energy barrier for the electrons and the holes at quantum well 208. The increase in the energy barrier for the holes reduces the number of the holes from p-type semiconductor layer 206, which are thermally ejected from quantum well 208 into n-type semiconductor layer 204. Similarly, the increase in the energy barrier for the electrons reduces the number of the electrons from n-type semiconductor layer 204, which are thermally ejected from quantum well 208 into p-type semiconductor layer 206. In addition, the increase in the energy barrier for the holes and the electrons results in an increased rate of electron-hole recombinations in quantum well 208. An increased rate of electron-hole recombinations in quantum well 208 reduces the amount of electric current required to produce a desired amount of laser light from semiconductor laser diode 200.

For example, in semiconductor laser diode 200, where AlGaAs is used to form p-type semiconductor layer 206 and InGaAsP is used to form n-type semiconductor layer 204, the holes at quantum well 208 have a larger energy barrier for moving towards n-type semiconductor layer 204, and the electrons have a larger energy barrier at quantum well 208 for moving towards p-type semiconductor layer 206. The increase in the energy barrier for the holes and the electrons results in an increased rate of electron-hole recombinations in quantum well 208. This increase in the rate of electron-hole recombinations in quantum well 208 reduces the electric current required to produce a desired amount of laser light from semiconductor laser diode 200. The lower conduction band offset of the second material system compared to that of the third material system, and the lower valence band offsets of the third material system compared to that of the second material system lower the turn-on voltage for semiconductor laser diode 200.

In an embodiment of the invention, semiconductor laser diode 200 further includes an n-contact metal 210 such as Titanium-Platinum-Gold (Ti—Pt—Au) stack placed over a Gold-Germanium (Au—Ge) alloy and a p-contact metal 212 such as Titanium-Platinum-Gold (Ti—Pt—Au) stack placed over a Gold-Germanium (Au—Ge) alloy. n-contact metal 210 is provided on substrate 202. p-contact metal 212 is provided on p-type semiconductor layer 206. n-contact metal 210 provides an electric connection to n-type semiconductor layer 204. p-contact metal 212 provides an electrical connection to p-type semiconductor layer 206.

Figure 2B:
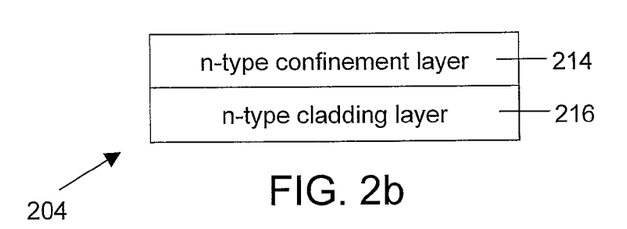

FIG. 2b illustrates n-type semiconductor layer 204, in accordance with an embodiment of the invention. n-type semiconductor layer 204 includes two sub-layers, an n-type confinement layer 214 and an n-type cladding layer 216. The composition of n-type confinement layer 214 and n-type cladding layer 216, for a lasing wavelength of the laser, is selected such that the refractive index of n-type confinement layer 214 is larger than the refractive index of n-type cladding layer 216 and a total internal reflection condition for light emitted in quantum well 208 is achieved. n-type confinement layer 214 and n-type cladding layer 216 with such a composition forms half of a waveguide that contains the laser light emitted in quantum well 208.

In an embodiment of the invention, to contain the emitted laser light within quantum well 208, n-type confinement layer 214 is composed of In: 11.7%, Ga: 38.3%, P: 23.8% and As: 26.2%, n-type cladding layer 216 is composed of In: 25%, Ga: 25% and P: 50%, and quantum well 208 is composed of In: 6%, Ga: 44% and As: 50%. n-type confinement layer 214 is doped with Silicon. The concentration of Silicon may vary from 0 atoms to $10^{17}$ atoms per $cm^3$ of n-type confinement layer 214. n-type cladding layer 216 is doped with Silicon. The concentration of Silicon is $10^{18}$ atoms to $5\times10^{18}$ atoms per $cm^3$ of n-type cladding layer 216.

Figure 2C:
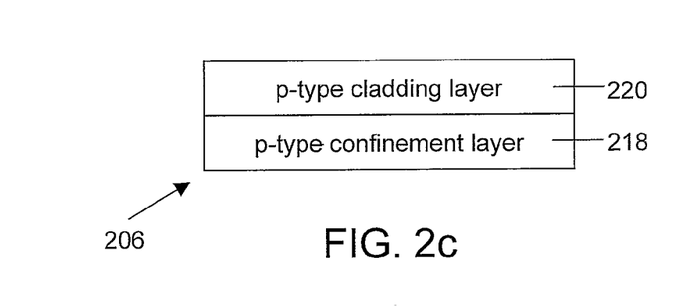

FIG. 2c illustrates p-type semiconductor layer 206, in accordance with an embodiment of the invention. p-type semiconductor layer 206 includes two sub-layers, a p-type confinement layer 218 and a p-type cladding layer 220. The composition of p-type confinement layer 218 and p-type cladding layer 220, for a lasing wavelength of the laser, is selected such that the refractive index of p-type confinement layer 218 is larger than the refractive index of p-type cladding layer 220 and a total internal reflection condition for light emitted in quantum well 208 is achieved. p-type confinement layer 218 and p-type cladding layer 220 with such a composition form half of a waveguide that contains the laser light emitted in quantum well 208.

In an embodiment of the invention, to contain the emitted laser light within quantum well 208, p-type confinement layer 218 is composed of Al: 10%, Ga: 40% and As: 50%, p-type cladding layer 220 is composed of Al: 25%, Ga: 25% and As: 50%, and quantum well 208 is composed of In: 6%, Ga: 44% and As: 50%. p-type confinement layer 218 is doped with Zinc. The concentration of Zinc may vary from 0 atoms to $10^{17}$ atoms per $cm^3$ of p-type confinement layer 218. p-type cladding layer 220 is doped with Zinc. The concentration of Zinc may vary from $10^{18}$ atoms to $5\times10^{18}$ atoms per $cm^3$ of p-type cladding layer 220.

Figure 2D:
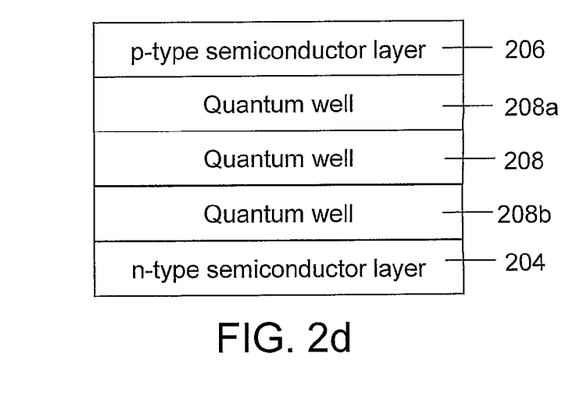

In an embodiment of the invention, semiconductor laser diode 200 includes one or more quantum wells as illustrated in FIG. 2d. The one or more quantum wells are provided to produce an intense beam of laser light. The one or more quantum wells are disposed between n-type semiconductor layer 204 and p-type semiconductor layer 206. As shown in FIG. 2d, semiconductor laser diode 200 includes a quantum well 208a, quantum well 208 and a quantum well 208b. Quantum well 208a is disposed adjacent to p-type semiconductor layer 206 and quantum well 208b is disposed adjacent to n-type semiconductor layer 204.

In one embodiment, where n-type semiconductor layer 204 includes a plurality of n-type confinement layers, at least one of the plurality of n-type confinement layers is adjacent to one of the one or more quantum wells. The composition of the plurality of n-type confinement layers is varied such that the refractive index of the n-type confinement layers gradually decreases. The n-type confinement layer near the quantum well has the largest refractive index and the n-type confinement layer farthest from the quantum well has the lowest refractive index. The plurality of n-type confinement layers with varying refractive indices result in a better confinement of the emitted laser light.

In one embodiment, where p-type semiconductor layer 206 includes a plurality of p-type confinement layers, at least one of the plurality of p-type confinement layers is adjacent to one of the one or more quantum wells.

Figure 3:
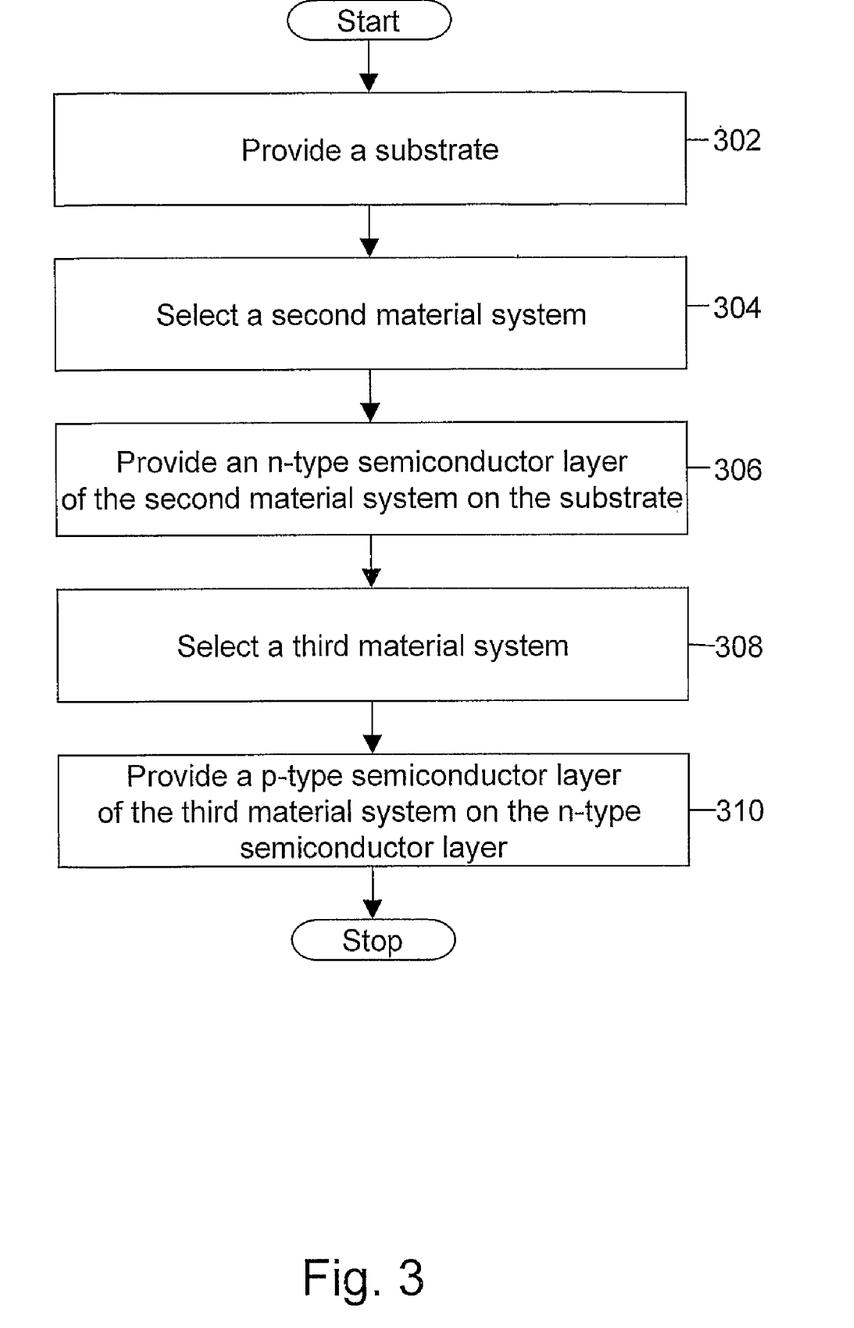
FIG. 3 is a flowchart of a method for forming a p-n junction, in accordance with an embodiment of the invention.

FIG. 3 is a flowchart of a method for forming a p-n junction, in accordance with an embodiment of the invention. At step 302, a substrate is provided for forming the p-n junction. The substrate is formed from a first material system. The first material system includes materials such as Indium (In), Gallium (Ga), Aluminum (Al), Arsenic (As) and Phosphorous (P). Examples of the first material system include GaAs and InP. However, it will be apparent to a person skilled in the art that any other relevant material system may be used to form the substrate. At step 304, a second material system is selected. In an embodiment of the invention, the second material system includes materials such as Indium (In), Gallium (Ga), Aluminum (Al), Arsenic (As) and Phosphorous (P). Examples of the second material system include InGaAsP and AlInGaP. At step 306, an n-type semiconductor layer is provided on the substrate. The n-type semiconductor layer is formed from the second material system.

At step 308, a third material system is selected. The third material system includes materials such as Indium (In), Gallium (Ga), Aluminum (Al), Arsenic (As) and Phosphorous (P). For example, AlGaAs may be used as a third material system. At step 310, a p-type semiconductor layer is provided on the n-type semiconductor layer. The p-type semiconductor layer is formed from the third material system. The n-type semiconductor layer and the p-type semiconductor layer form the p-n junction.

The second material system is selected such that the second material system has a conduction band offset lower than the conduction band offset of the third material system. The conduction band offset is calculated relative to the conduction band energy of the first material system. The lower conduction band offset of the second material system compared to that of the third material system results in a lower turn-on voltage for the p-n junction. The third material system is selected such that the third material system has a valence band offset lower than the valence band offset of the second material system. The valence band offsets are calculated relative to the valence band energy of the first material system. The lower valence band offset of the third material system compared to that of the second material system results in a lower turn-on voltage for the p-n junction.

In an embodiment of the invention, an n-contact metal such as Titanium-Platinum-Gold (Ti—Pt—Au) stack placed over a Gold-Germanium (Au—Ge) alloy is provided on the substrate and a p-contact metal such as Titanium-Platinum-Gold (Ti—Pt—Au) stack placed over a Gold-Germanium (Au—Ge) alloy is provided on the p-type semiconductor layer. The n-contact metal provides an electrical connection to the n-type semiconductor layer of the p-n junction. The p-contact metal provides an electrical connection to the p-type semiconductor layer of the p-n junction.

In a p-n junction, where the n-type semiconductor layer is formed from the second material system, and the p-type semiconductor layer is formed from the third material system, the combination of the lower conduction band offset of the second material system and the lower valence band offset of the third material system results in a lower turn-on voltage for the p-n junction.

Figure 4:
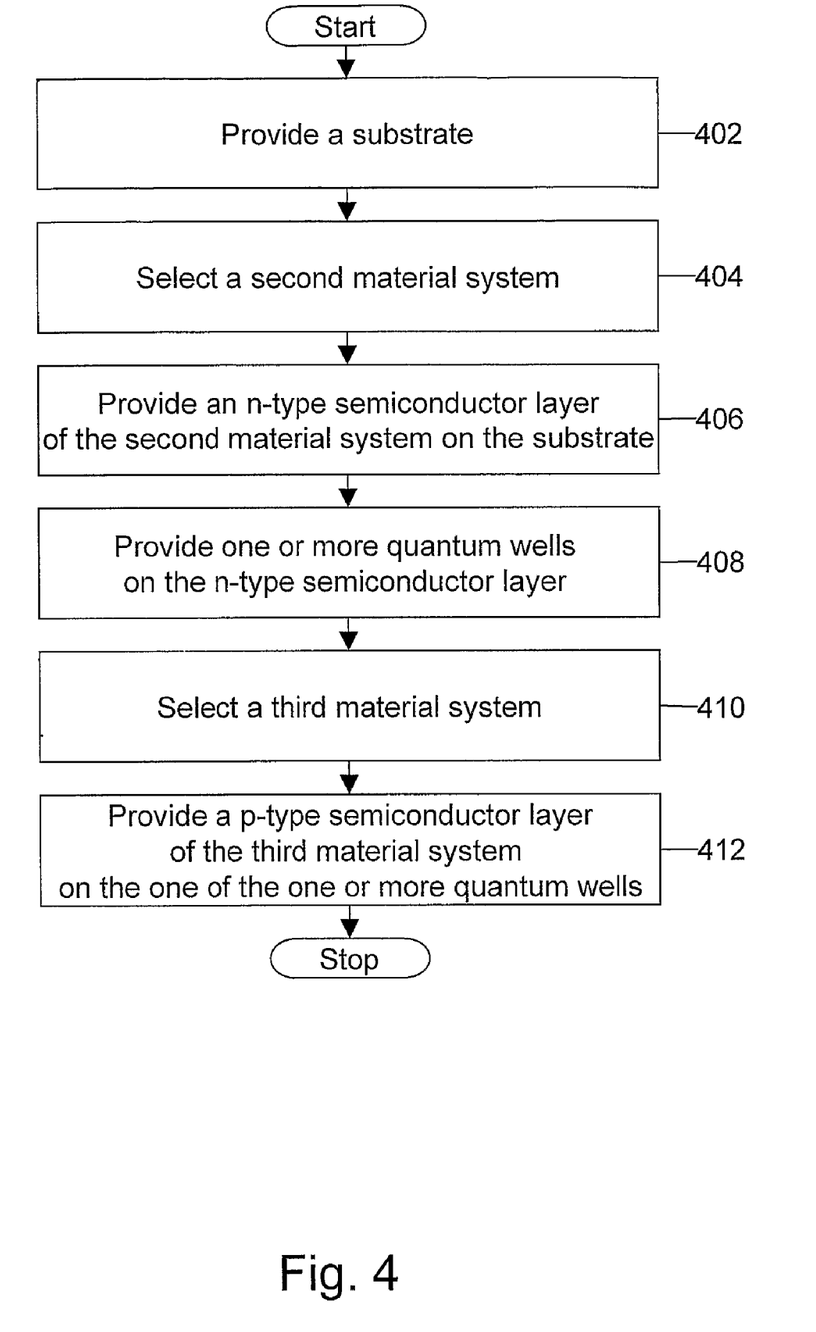
FIG. 4 is a flowchart of a method for forming a semiconductor laser diode, in accordance with an embodiment of the invention.

FIG. 4 is a flowchart of a method for forming a semiconductor laser diode, in accordance with an embodiment of the invention. Semiconductor laser diodes are diodes that emit coherent light by stimulated emission. At step 402, a substrate is provided for forming the semiconductor laser diode. The substrate is formed from a first material system. The first material system includes materials such as Indium (In), Gallium (Ga), Aluminum (Al), Arsenic (As) and Phosphorous (P). Examples of the first material system include GaAs and InP. However, it will be apparent to a person skilled in the art that any other relevant material system may be used to form the substrate.

At step 404, a second material system is selected. In an embodiment of the invention, the second material system includes materials such as Indium (In), Gallium (Ga), Aluminum (Al), Arsenic (As) and Phosphorous (P). Examples of the second material system include InGaAsP and AlInGaP. At step 406, an n-type semiconductor layer is provided on the substrate. The n-type semiconductor layer is formed from the second material system. At step 408, one or more quantum wells are provided. The one or more quantum wells are provided on the n-type semiconductor layer.

At step 410, a third material system is selected. The third material system includes materials such as Indium (In), Gallium (Ga), Aluminum (Al), Arsenic (As) and Phosphorous (P). For example, AlGaAs may be used as a third material system. At step 412, a p-type semiconductor layer is provided on the n-type semiconductor layer. The p-type semiconductor layer is formed from the third material system. The p-type semiconductor layer is provided such that the one or more quantum wells are between the n-type semiconductor layer and the p-type semiconductor layer. The one or more quantum wells are formed from a fourth material system. The fourth material system includes materials such as Indium (In), Gallium (Ga), Aluminum (Al), Arsenic (As) and Phosphorous (P). Examples of the fourth material system include InGaAsP, AlGaAs and AlInGaP.

In an embodiment of the invention, an n-contact metal such as Titanium-Platinum-Gold (Ti—Pt—Au) stack placed over a Gold-Germanium (Au—Ge) alloy is provided on the substrate and a p-contact metal such as Titanium-Platinum-Gold (Ti—Pt—Au) stack placed over a Gold-Germanium (Au—Ge) alloy is provided on the p-type semiconductor layer. The n-contact metal provides an electrical connection to the n-type semiconductor layer. The p-contact metal provides an electrical connection to the p-type semiconductor layer.

The second material system is selected such that the second material system has a conduction band offset lower than the conduction band offset of the third material system. The conduction band offset is calculated relative to the conduction band energy of the first material system. The third material system is selected such that the third material system has a valence band offset lower than the valence band offset of the second material system. The valence band offsets are calculated relative to the valence band energy of the first material system. In an embodiment of the invention, the second material system and the third material system are selected based on the graph of optical index vs. band offset. The selection of the second material system and the third material system based on the graph of optical index vs. band offset is explained in conjunction with FIG. 5.

The use of the second material system with a lower conduction band offset compared to that of the third material system, for the n-type semiconductor layer and the use of the third material system with a lower valence band offset compared to that of the second material system, for the p-type semiconductor layer results in an increase in the energy barrier for the holes and the electrons at the one or more quantum wells. The increase in the energy barrier for the holes reduces the number of the holes from the p-type semiconductor layer, which are thermally ejected from the one or more quantum wells into the n-type semiconductor layer. Similarly, the increase in the energy barrier for the electrons reduces the number of the electrons from the n-type semiconductor layer, which are thermally ejected from the one or more quantum wells into the p-type semiconductor layer. In addition, the increase in the energy barrier for the electrons and the holes results in an increased rate of electron-hole recombinations in the one or more quantum wells. An increase in the rate of electron-hole recombinations in the one or more quantum wells reduces the amount of electric current required to produce a desired amount of laser light from the semiconductor laser diode.

Figure 5:
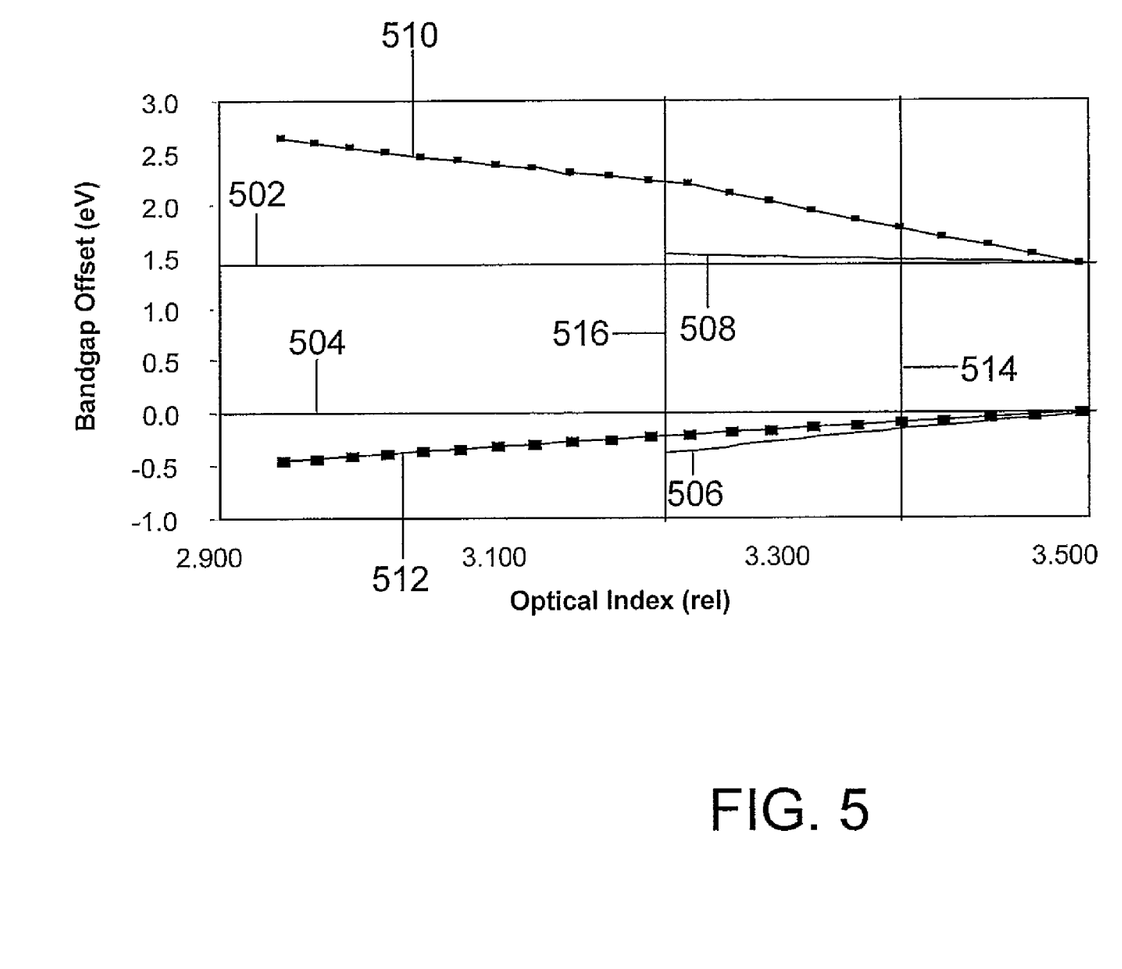
FIG. 5 is a graph of optical index versus band offset for GaAs (Gallium Arsenide), InGaAsP (Indium Gallium Arsenide Phosphide), and AlGaAs (Aluminum Gallium Arsenide) material systems.

In an embodiment of the present invention, the second and the third material systems are selected using a graph of optical index vs. band offset for a plurality of material systems, which may be used to form a semiconductor laser diode. An exemplary process for selecting the second and the third material systems for a semiconductor laser diode with a substrate formed from GaAs and having an n-type confinement layer, an n-type cladding layer, a p-type confinement layer, and a p-type cladding layer with the optical index value of each confinement layer being larger than the respective cladding layers, is illustrated in FIG. 5. The layers of the semiconductor laser diode form a waveguide within the semiconductor laser diode. A first optical index value is desired for the confinement layers and second optical index value is desired for the cladding layers of the semiconductor laser diode. The first optical index value is larger than the second optical index value.

FIG. 5 is a graph of optical index vs. band energy for the material systems GaAs, InGaAsP and AlGaAs. The X-axis of the graph represents optical index values of a material system. The Y-axis of the graph represents the energy associated with the electronic band structure of a material system in electron volts (eV), as referenced to the valence band energy of GaAs. The energy associated with the electronic band structure of a material system is used to determine the corresponding band offset of the material system relative to the band energy of the material system used for the substrate. The band offset may also be referred to as bandgap offset.

The conduction band energy and the valence band energy for GaAs are shown by curves 502 and 504 respectively. The conduction band energy and valence band energy for InGaAsP are shown by curves 508 and 506 respectively, for different compositions of InGaAsP that range in formulation from pure GaAs (Ga: 50% and As: 50%) to $In_{0.5}Ga_{0.5}P$ (In: 25%, Ga: 25% and P: 50%) while remaining lattice matched to the GaAs substrate. The conduction band and valence band energies for AlGaAs are shown by curves 510 and 512 respectively, for different compositions of AlGaAs that range in formulation from pure GaAs (Ga: 50% and As: 50%) to AlAs (Al: 50% and As: 50%). As the composition of InGaAsP or AlGaAs is varied over the above-mentioned range of composition, the respective optical index value, conduction band energy, and valence band energy change. The variation of band energy and optical index value as a function of composition of a material system is well known in the art [M. Levinshtein, et. al; Handbook Series on Semiconductor Parameters, Volume 2, World Scientific Publishing Co., 1999]. The variation of band energy and optical index value over the entire range of composition for InGaAsP forms curves 506, and 508, and for AlGaAs forms curves 510 and 512. The difference between the conduction band energy represented by curve 508 and the conduction band energy represented by curve 502 is the conduction band offset of InGaAsP relative to GaAs. The difference between the conduction band energy represented by curve 510 and the conduction band energy represented by curve 502 is the conduction band offset of AlGaAs relative to GaAs. The difference between the valence band energy represented by curve 506 and the valence band energy represented by curve 504 is the valence band offset of InGaAsP relative to GaAs. The difference between the valence band energy represented by curve 512 and the valence band energy represented by curve 504 is the valence band offset of AlGaAs relative to GaAs. Line 514 represents a constant optical index value line corresponding to the first optical index value and line 516 represents a constant optical index value line corresponding to the second optical index value.

The points at which the constant optical index value lines 514 and 516 intersect the band energy curves 506, 508, 510 and 512, determine the material system to be used and the compositions of the material systems to be used for different layers of the semiconductor laser diode. The point at which constant optical index value line 514 intersects the AlGaAs conduction band energy curve 510 determines the composition of AlGaAs, which has optical index value equal to the first optical index value. The point at which constant optical index value line 514 intersects InGaAsP conduction band energy curve 508 determines the composition of InGaAsP, which has an optical index value equal to the first optical index value. The InGaAsP and AlGaAs have optical index values equal to the first optical index value, where curve 514 intersects curve 510 and 508. As a result, either of AlGaAs or InGaAsP may be used for forming the confinement layers of the semiconductor laser diode. However, the comparison of curves 510 and 508 to curve 502 shows that AlGaAs has a larger conduction band offset relative to GaAs than that of InGaAsP. Therefore, to lower the turn-on voltage of the semiconductor laser diode, InGaAsP is used to form the n-type confinement layer of the semiconductor laser diode. The comparison of curves 506 and 512 to curve 504 shows that AlGaAs has a smaller valence band offset relative to GaAs than that of InGaAsP. Therefore, to lower the turn-on voltage of the semiconductor laser diode, AlGaAs is used to form the p-type confinement layer of the semiconductor laser diode. In accordance with the process described for selecting the material systems and the composition of the material systems for the confinement layers of the semiconductor laser diode, the material systems and the composition of the material systems for the cladding layers of the semiconductor laser diode can be determined by analyzing the points at which the band energy curves 506 and 512 intersect curve 516.

The process described for selecting the material system and the composition of the material system for the confinement and the cladding layers of the semiconductor laser diode may be used in case where the semiconductor laser diode is desired to maintain the same optical properties of the waveguide as that of the waveguide of a single material system semiconductor laser diode. This is achieved by finding the material systems and the composition of the material systems for the layers of the semiconductor laser diode corresponding to the optical index values of the layers of the single material system semiconductor laser diode. A single material system semiconductor laser diode is a semiconductor laser diode formed from a single material system. The constant optical properties of the waveguide result in constant wavelength and beam shape of the semiconductor laser diode.

The present invention is further defined in the following examples. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various uses and conditions.

Figure 6:
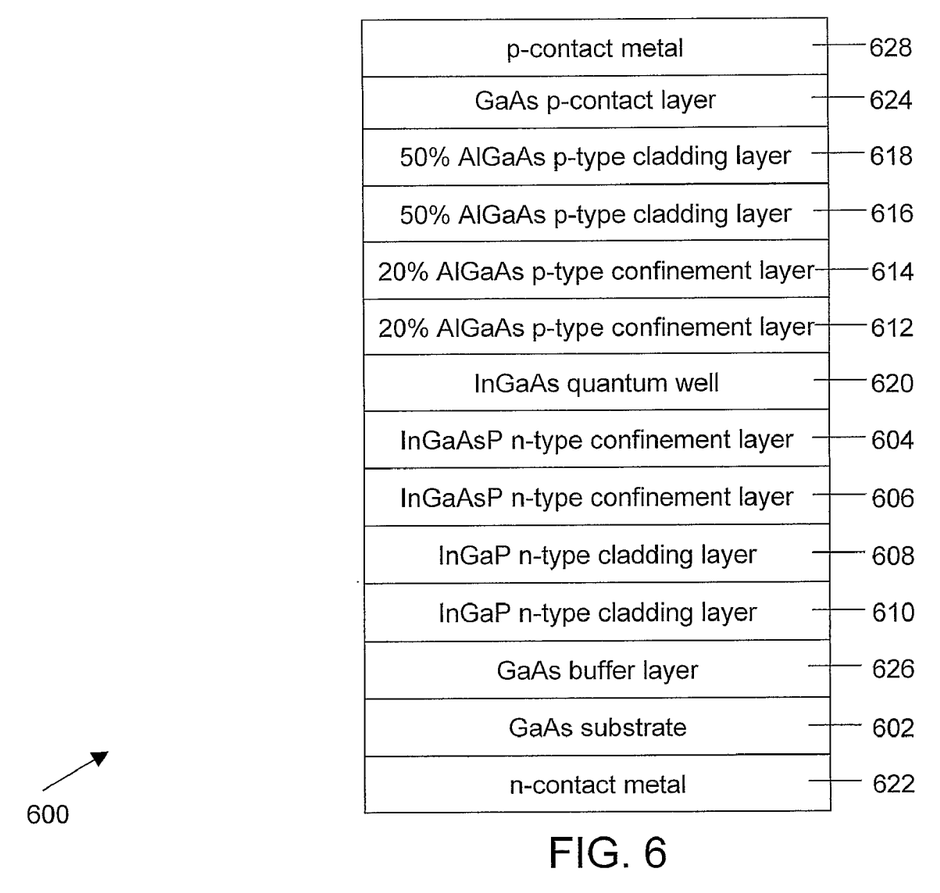
FIG. 6 illustrates a semiconductor laser diode, in accordance with an embodiment of the invention.
Figure 7A:
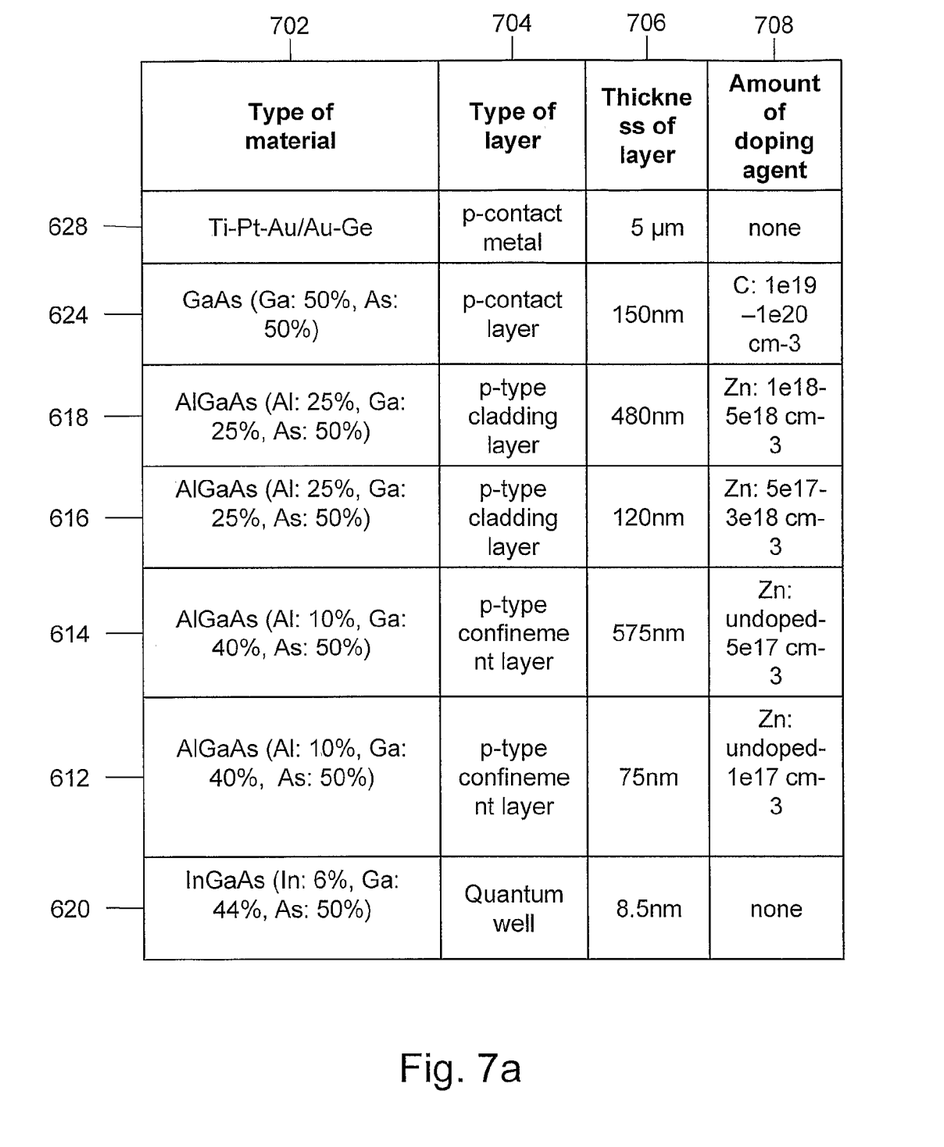
FIG. 7 is a table providing specifications of the semiconductor laser diode of FIG. 6
Figure 7B:
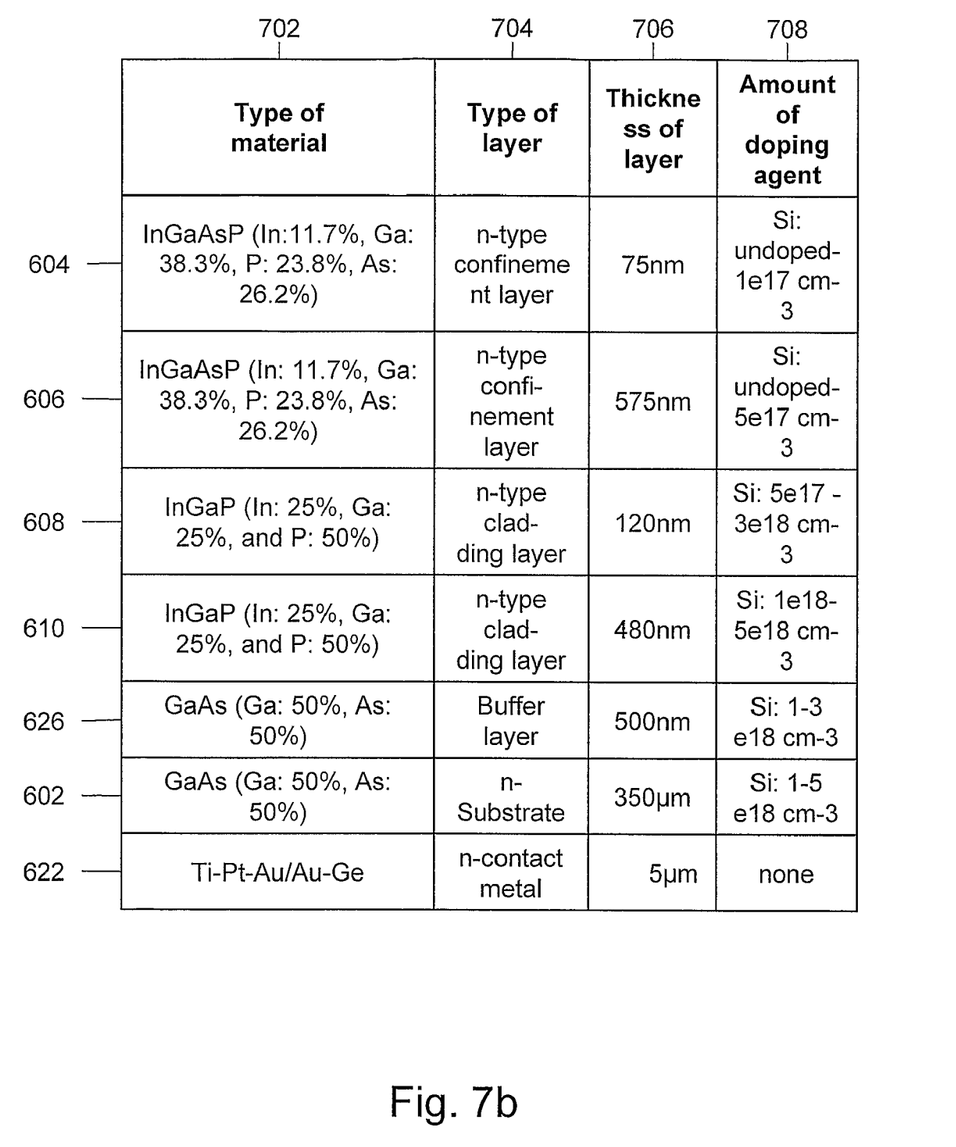

FIG. 6 illustrates the layers of a semiconductor laser diode 600, in accordance with an exemplary embodiment of the invention, the details of which are set out in FIG. 7a and FIG. 7b. Semiconductor laser diode 600 includes a substrate 602, an n-type confinement layer 604, an n-type confinement layer 606, an n-type cladding layer 608, an n-type cladding layer 610, a p-type confinement layer 612, a p-type confinement layer 614, a p-type cladding layer 616, a p-type cladding layer 618, a quantum well 620, an n-contact metal 622, a p-contact layer 624, a buffer layer 626, and a p-contact metal 628. n-type confinement layer 604 is disposed adjacent to quantum well 620. p-type confinement layer 612 is disposed adjacent to quantum well 620. n-contact metal 622 is provided on substrate 602. p-contact layer 624 is provided on p-type cladding layer 618. p-contact metal 628 is provided on p-contact layer 624. The functioning of a semiconductor laser diode has been explained in conjunction with FIG. 2.

FIGS. 7a and 7b are a table providing specifications of semiconductor laser diode 600. Column 702 provides the type of material used for a layer, column 704 provides the type of a layer, column 706 provides the thickness of a layer and column 708 provides the details of a doping agent used for doping a layer.

Substrate 602 has the composition Ga: 50% and As: 50%, a thickness of 350 microns (μm) and is doped with Silicon. The range of concentration of Silicon is $1 \times 10^{18}$ atoms to $5 \times 10^{18}$ atoms per $cm^3$ of substrate 602.

Buffer layer 626 has the composition Ga: 50% and As: 50%, a thickness of 500 nanometer (nm) and is doped with Silicon. The range of concentration of Silicon is $1 \times 10^{18}$ atoms to $2 \times 10^{18}$ atoms per cm$^3$ of buffer layer 626.

n-type confinement layer 604 has the composition In: 11.7%, Ga: 38.3%, P: 23.8% and As: 26.2%, and a thickness of 75 nm. n-type confinement layer 606 has the composition In: 11.7%, Ga: 38.3%, P: 23.8% and As: 26.2%, a thickness of 575 nm and is doped with Silicon. The concentration of Silicon may vary from 0 atoms to $10^{17}$ atoms per cm$^3$ of n-type confinement layer 606. n-type cladding layer 608 has the composition In: 25%, Ga: 25% and P: 50%, a thickness of 120 nm and is doped with Silicon. The concentration of Silicon is $5 \times 10^{17}$ atoms to $3 \times 10^{18}$ atoms per cm$^3$ of n-type cladding layer 608. n-type cladding layer 610 has composition In: 25%, Ga: 25% and P: 50%, a thickness of 480 nm and is doped with Silicon. The concentration of Silicon is $1 \times 10^{18}$ atoms to $5 \times 10^{18}$ atoms per cm$^3$ of n-type cladding layer 610.

p-type confinement layer 612 has the composition Al: 10%, Ga: 40% and As: 50%, and a thickness of 75 nm. p-type confinement layer 614 has composition Al: 10%, Ga: 40% and As: 50%, a thickness of 575 nm and is doped with Zinc. The concentration of Zinc is 0 atoms to $5 \times 10^{17}$ atoms per cm$^3$ of p-type confinement layer 614. p-type cladding layer 616 has composition Al: 25%, Ga: 25% and As: 50%, a thickness of 120 nm and is doped with Zinc. The concentration of Zinc is $5 \times 10^{17}$ atoms to $3 \times 10^{18}$ atoms per cm$^3$ of p-type cladding layer 616. p-type cladding layer 618 has the composition Al: 25%, Ga: 25% and As: 50%, a thickness of 480 nm and is doped with Zinc. The concentration of Zinc is $1 \times 10^{18}$ atoms to $5 \times 10^{18}$ atoms per cm$^3$ of p-type cladding layer 618. Quantum well 620 has the composition In: 6%, Ga: 44% and As: 50%, and a thickness of 8.5 nm. n-contact metal 622 is formed from a Titanium-Platinum-Gold (Ti—Pt—Au) stack placed over a Gold-Germanium (Au—Ge) alloy, which is in contact with GaAs substrate 602. n-contact metal 622 has a thickness of 5 μm.

GaAs p-contact layer 624 has the composition Ga: 50% and As: 50%, a thickness of 150 nm and is doped with Carbon. The concentration of Carbon is $1 \times 10^{19}$ atoms to $1 \times 10^{20}$ atoms per cm$^3$ of p-contact layer 624. p-contact metal 628 is formed from a Ti—Pt—Au stack placed over an Au—Ge alloy which is in contact with GaAs p-contact layer 624. p-contact metal 628 has a thickness of 5 μm. InGaAsP has a bandgap of 1.62 eV. Semiconductor laser diode 600 emits laser light of wavelength 975 nm. The turn-on voltage for semiconductor laser diode 600 is 1.35 Volts.

The various embodiments describe the use of different material systems for forming the n-type semiconductor layers and the p-type semiconductor layers of a p-n junction of a semiconductor laser diode. The use of different material systems for forming the n-type semiconductor layers and the p-type semiconductor layers results in an increased rate of electron-hole recombinations in the quantum well of a semiconductor laser diode. The increase in the rate of electron-hole recombinations lowers the turn-on voltage and increases the power conversion efficiency of the semiconductor laser diode.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A p-n junction for use in an electronic device, the p-n junction comprising:

a substrate, the substrate being formed from a first material system, the first material system comprising a plurality of materials;

an n-type semiconductor layer, the n-type semiconductor layer being formed from a second material system, the second material system comprising a plurality of materials; and a p-type semiconductor layer, the p-type semiconductor layer being formed from a third material system, the third material system comprising a plurality of materials, the third material system being different from the second material system, wherein at least one of the n-type and p-type semiconductor layers comprise a plurality of sub-layers, one or more of the plurality of sub-layers comprising different combinations of the plurality of materials present in their respective material systems, the second material system having a conduction band offset lower than a conduction band offset of the third material system, the third material system having a valence band offset lower than a valence band offset of the second material system, the conduction band and the valence band offsets being calculated relative to the respective band energies of the first material system, the first material system being different from the second material system and the third material system, the p-n junction formed from the n-type and the p-type semiconductor layers has a lowered turn-on voltage.

2. The p-n junction of claim 1, wherein the electronic device is selected from a group consisting of a transistor, a diode, a light emitting diode and a semiconductor laser diode.

3. The p-n junction of claim 1, wherein the first, the second and the third material systems are made from one or more of materials selected from a group of Indium, Gallium, Aluminium, Arsenic and Phosphorous.

4. A semiconductor laser diode, the semiconductor laser diode comprising:

a substrate, the substrate being formed from a first material system, the first material system comprising a plurality of materials;

an n-type semiconductor layer, the n-type semiconductor layer being formed from a second material system, the second material system comprising a plurality of materials;

a p-type semiconductor layer, the p-type semiconductor layer being formed from a third material system, the third material system comprising a plurality of materials, the third material system being different from the second material system, wherein at least one of the n-type and p-type semiconductor layers comprise a plurality of sub-layers, one or more of the plurality of sub-layers comprising different combinations of the plurality of materials present in their respective material systems;

one or more quantum wells, the one or more quantum wells being disposed between the n-type semiconductor layer and the p-type semiconductor layer, the one or more quantum wells being formed from a fourth material system, the fourth material system comprising a plurality of materials, and wherein the second material system has a conduction band offset lower than the conduction band offset of the third material system, the third material system has a valence band offset lower than the valence band offset of the second material system, the conduction band and valence band offsets being calculated relative to the respective band energies of the first material system, the first material system being different from the second material system and the third material system, the semiconductor laser diode formed from the n-type semiconductor layer and the p-type semiconductor layer has a higher rate of radiative recombination of electrons from the n-type semiconductor layer and holes from the p-type semiconductor layer in the one or more quantum wells, resulting in an emission of laser light and a lowered turn-on voltage.

5. The semiconductor laser diode of claim 4, wherein the n-type semiconductor layer comprises a plurality of sub-layers.

6. The semiconductor laser diode of claim 5, wherein the plurality of sub-layers of the n-type semiconductor layer form half of a waveguide for the laser light emitted in the one or more quantum wells.

7. The semiconductor laser diode of claim 4, wherein the n-type semiconductor layer comprises one or more confinement sub-layers.

8. The semiconductor laser diode of claim 7, wherein one of the one or more confinement sub-layers of the n-type semiconductor layer is disposed adjacent to one of the one or more quantum wells.

9. The semiconductor laser diode of claim 4, wherein the n-type semiconductor layer comprises one or more cladding sub-layers.

10. The semiconductor laser diode of claim 4, wherein the p-type semiconductor layer comprises a plurality of sub-layers.

11. The semiconductor laser diode of claim 10, wherein the plurality of sub-layers of the p-type semiconductor layer form half of a waveguide for the laser light emitted in the one or more quantum wells.

12. The semiconductor laser diode of claim 4, wherein the p-type semiconductor layer comprises one or more confinement sub-layers.

13. The semiconductor laser diode of claim 12, wherein one of the one or more confinement sub-layers is disposed adjacent to one of the one or more quantum wells.

14. The semiconductor laser diode of claim 4, wherein the p-type semiconductor layer comprises one or more cladding sub-layers.

15. The semiconductor laser diode of claim 4, wherein the n-type semiconductor layer and the p-type semiconductor layer form a waveguide for the laser light emitted in the one or more quantum wells.

16. The semiconductor laser diode of claim 4, wherein the first, the second, the third, and the fourth material systems are made from one or more of materials selected from a group of Indium, Gallium, Aluminium, Arsenic and Phosphorous.

17. A semiconductor laser diode, the semiconductor laser diode comprising:
a substrate, the substrate being formed from a first material system, the first material system comprising a plurality of materials;
a buffer layer, the buffer layer being provided on the substrate;
one or more n-type cladding layers, the one or more n-type cladding layers being provided on the buffer layer, the one or more n-type cladding layers being formed from a second material system, the second material system comprising a plurality of materials;
one or more n-type confinement layers, the one or more n-type confinement layers being provided on the one or more n-type cladding layers, wherein the one or more n-type confinement layers are formed from the second material system;
one or more quantum wells, the one or more quantum wells being provided on the one or more n-type confinement layers;
one or more p-type confinement layers, the one or more p-type confinement layers being provided on the one or more quantum wells, the one or more p-type confinement layers being formed from a third material system, the third material system comprising a plurality of materials;
one or more p-type cladding layers, the one or more p-type cladding layers being provided on the one or more p-type confinement layers, the one or more p-type cladding layers being formed from the third material system, wherein at least one of the n-type cladding and confinement layers, and p-type cladding and confinement layers comprise combinations of the plurality of materials present in their respective material systems;
a p-contact layer, the p-contact layer being provided on the one or more p-type cladding layers, and
wherein the second material system has a conduction band offset lower than the conduction band offset of the third material system, the third material system has a valence band offset lower than the valence band offset of the second material system, the conduction band and the valence band offsets being calculated relative to the respective band energies of the first material system, the first material system being different from the second material system and the third material system, the semiconductor laser diode formed from the n-type semiconductor layer and the p-type semiconductor layer has a higher rate of radiative recombination of electrons from the n-type semiconductor layer and holes from the p-type semiconductor layer in the one or more quantum wells, resulting in an emission of laser light and a lowered turn-on voltage.

18. The semiconductor laser diode of claim 17 further comprising an n-contact metal, the n-contact metal being provided on the substrate.

19. The semiconductor laser diode of claim 17 further comprising a p-contact metal the p-contact metal being provided on the p-contact layer.

20. A method for forming a p-n junction, the method comprising:
providing a substrate, the substrate being formed from a first material system, the first material system comprising a plurality of materials;
selecting a second material system, the second material system comprising a plurality of materials;
providing an n-type semiconductor layer on the substrate, the n-type semiconductor layer being formed from the second material system;
selecting a third material system, the third material system comprising a plurality of materials, the third material system being different from the second material system;
providing a p-type semiconductor layer, the p-type semiconductor layer being formed from the third material system, wherein at least one of the n-type and p-type semiconductor layers comprise a plurality of sub-layers, one or more of the plurality of sub-layers comprising different combinations of the plurality of materials present in their respective material systems, and
the second material system having a conduction band offset lower than the conduction band offset of the third material system, the third material system having a valence band offset lower than the valence band offset of the second material system, the conduction band and the valence band offsets being calculated relative to the respective band energies of the first material system, the first material system being different from the second material system and the third material system, the p-n junction formed from the n-type and the p-type semiconductor layers has a lowered turn-on voltage.

21. The method of claim 20, wherein the first material, the second and the third material systems are made from one or more of materials selected from a group of Indium, Gallium, Aluminium, Arsenic and Phosphorous.

22. A method for forming a semiconductor laser diode, the method comprising:
providing a substrate, the substrate being formed from a first material system, the first material system comprising a plurality of materials;
selecting a second material system, the second material system comprising a plurality of materials;
providing an n-type semiconductor layer on the substrate, the n-type semiconductor layer being formed from the second material system;
providing one or more quantum wells, the one or more quantum wells being provided on the n-type semiconductor layer;
selecting a third material system, the third material system being different from the second material system; and
providing a p-type semiconductor layer on the one or more quantum wells, the p-type semiconductor layer being formed from the third material system, the third material system comprising a plurality of materials, wherein at least one of the n-type and p-type semiconductor layers comprise a plurality of sub-layers, one or more of the plurality of sub-layers comprising different combinations of the plurality of materials present in their respective material systems,
wherein the second material system has a conduction band offset lower than the conduction band offset of the third material system, the third material system has a valence band offset lower than the valence band offset of the second material system, the conduction band and the valence band offsets being calculated relative to respective band energies of the first material system, the first material system being different from the second material system and the third material system, the semiconductor laser diode formed from the n-type semiconductor layer and the p-type semiconductor layer has a higher rate of radiative recombination of electrons from the n-type semiconductor layer and holes from the p-type semiconductor layer in the one or more quantum wells, resulting in an emission of laser light and a lowered turn-on voltage, the one or more quantum wells being formed from a fourth material system.

23. The method of claim 22, wherein the n-type semiconductor layer comprises a plurality of sub-layers.

24. The method of claim 23, wherein the plurality of sub-layers of the n-type semiconductor layer form half of a waveguide for the laser light emitted in the one or more quantum wells.

25. The method of claim 22, wherein the n-type semiconductor layer comprises one or more confinement sub-layers.

26. The method of claim 25, wherein one of the one or more confinement sub-layers is disposed adjacent to one of the one or more quantum wells.

27. The method of claim 22, wherein the n-type semiconductor layer comprises one or more cladding sub-layers.

28. The method of claim 22, wherein the p-type semiconductor layer comprises a plurality of sub-layers.

29. The method of claim 28, wherein the plurality of sub-layers of the p-type semiconductor layer form half of a waveguide for the laser light emitted in the one or more quantum wells.

30. The method of claim 22, wherein the p-type semiconductor layer comprises one or more confinement sub-layers.

31. The method of claim 30, wherein one of the one or more confinement sub-layers is disposed adjacent to one of the one or more quantum wells.

32. The method of claim 22, wherein the p-type semiconductor layer comprises one or more cladding sub-layers.

33. The method of claim 22, wherein the n-type semiconductor layer and the p-type semiconductor layer form a waveguide for the laser light emitted in the one or more quantum wells.

34. The method of claim 22, wherein the first, the second, the third and the fourth material systems are made from one or more of materials selected from a group of Indium, Gallium, Aluminium, Arsenic and Phosphorous.

* * * * *